(12) United States Patent
Yamazaki

(10) Patent No.: US 8,524,102 B2
(45) Date of Patent: Sep. 3, 2013

(54) ASHING METHOD AND ASHING DEVICE

(75) Inventor: Katsuhiro Yamazaki, Yokohama (JP)

(73) Assignee: Shibaura Mechatronics Corporation, Kanagawa (JP)

( * ) Notice: Subject to any disclaimer, the term of this patent is extended or adjusted under 35 U.S.C. 154(b) by 169 days.

(21) Appl. No.: 13/031,538

(22) Filed: Feb. 21, 2011

(65) Prior Publication Data

US 2011/0143546 A1 Jun. 16, 2011

Related U.S. Application Data

(62) Division of application No. 11/574,571, filed as application No. PCT/JP2004/018629 on Dec. 14, 2004, now abandoned.

(30) Foreign Application Priority Data

Sep. 1, 2004 (JP) ................................. 2004-254248

(51) Int. Cl.
  *B44C 1/22* (2006.01)
(52) U.S. Cl.
  USPC .............................. 216/67; 438/706; 438/712
(58) Field of Classification Search
  USPC .................................... 216/67; 438/706, 712
  See application file for complete search history.

(56) References Cited

U.S. PATENT DOCUMENTS

| | | | |
|---|---|---|---|
| 4,836,902 A | 6/1989 | Kalnitsky et al. | |
| 4,961,820 A | 10/1990 | Shinagawa et al. | |
| 6,263,830 B1 | 7/2001 | Kamarehi et al. | |
| 6,281,135 B1 | 8/2001 | Han et al. | |
| 6,551,939 B2 * | 4/2003 | Takamatsu et al. | 438/706 |
| 6,630,406 B2 * | 10/2003 | Waldfried et al. | 438/710 |
| 6,777,325 B2 * | 8/2004 | Ryuzaki et al. | 438/637 |
| 2001/0024769 A1 * | 9/2001 | Donoghue et al. | 430/329 |
| 2002/0119677 A1 | 8/2002 | Soda et al. | |
| 2003/0054656 A1 | 3/2003 | Soda | |
| 2005/0106875 A1 * | 5/2005 | Kubota et al. | 438/689 |
| 2006/0213865 A1 | 9/2006 | Honda et al. | |
| 2007/0017636 A1 | 1/2007 | Goto et al. | |

FOREIGN PATENT DOCUMENTS

| | | |
|---|---|---|
| JP | 6349786 | 12/1994 |
| JP | 2000183040 | 6/2000 |
| JP | 2001-110775 | 4/2001 |
| JP | 2002-261092 | 9/2002 |

(Continued)

OTHER PUBLICATIONS

Matsushita, A. et al. "Low Damage Ashing Using H2/He Plasma for Porous Ultra Low-k", 2003 IEEE, Japan, pp. 147-149.

(Continued)

*Primary Examiner* — Lan Vinh
*Assistant Examiner* — Maki Angadi

(57) ABSTRACT

An ashing device and ashing method that can positively remove resist from a wafer while preventing degradation of the film material properties of exposed porous Low-K film on the wafer. The ashing device of the present invention introduces a gas to a dielectric plasma generating chamber 14, excites said gas to generate a plasma, and performs plasma processing using said gas plasma on a processing work S in use of a Low-K film. The ashing gas introduced from a gas regulator 20 is an inert gas to which $H_2$ has been added. The configuration is formed so that plasma is generated from the gas blend, and the resist is removed by the hydrogen radicals generated.

8 Claims, 4 Drawing Sheets

(56) References Cited

FOREIGN PATENT DOCUMENTS

| | | |
|---|---|---|
| JP | 2002541672 | 12/2002 |
| JP | 2003092287 | 3/2003 |
| JP | 2004-087744 | 3/2004 |
| JP | 2004-128252 | 4/2004 |
| JP | 2005032750 | 2/2005 |
| WO | 98/59367 | 12/1998 |
| WO | 00/61384 | 10/2000 |
| WO | 0061384 | 10/2000 |
| WO | 01/29879 A2 | 4/2001 |
| WO | 01/29879 A3 | 4/2001 |
| WO | 2004/061928 | 7/2004 |

OTHER PUBLICATIONS

LaPedus, Mark, "Industry faces challenges with new low-k films", Jun. 13, 2005, www.eetimes.com/General/DisplayPrintViewContent?contengItemId=4053710, 3 pages.

* cited by examiner

ASHING METHOD AND ASHING DEVICE

Division of application Ser. No. 11/574,571, filed on Sep. 5, 2007, now abandoned and filed as application No. PCT/JP2004/018629 on Dec. 14, 2004.

TECHNICAL FIELD

The present invention relates to an ashing device for peeling photoresist that is used as a mask when making a circuit on a wafer in a semiconductor wafer process, and more particularly to technology to prevent reduction of the ashing rate and increase the life of a plasma generating chamber member.

BACKGROUND TECHNOLOGY

LSI (Large Scale Integration) circuits are semiconductor integrated circuits which have over 1000 elements, and ULSI or the like are those which have over one million elements stored on a single chip, and in recent years, 100 million or more elements have been formed on a single chip.

This type of ULSI cannot be accommodated simply by miniaturizing elements on a plane, so multiple layer wiring construction with a plurality of overlapping layers of wiring has become essential. A multiple layer wiring construction increases the capacitance between layers and causes the elements to have longer signal delay times, so in order to reduce the capacitance between layers, a low dielectric constant interlayer insulating film (hereinafter referred to as Low-K film) is used as an insulating film between layers.

Incidentally, the ashing process that removes the unneeded resist mask after patterning conventionally uses oxygen ($O_2$) plasma. However, the dielectric constant of Low-K films is dramatically increased by ashing with oxygen plasma. In particular, interlayer insulating films which use porous materials with a low relative dielectric constant have a plurality of fine air voids which are exposed (large relative surface area), so the resistance to highly reactive oxygen plasma is extremely low, the film properties are easily degraded, and the degradation due to oxygen plasma is very significant.

Therefore, technology has been developed to prevent degradation of a Low-K film by performing ashing using plasma produced from a gas blend containing nitrogen and hydrogen but no oxygen (Refer to Patent Reference 1), or to perform ashing using an oxygen-free plasma from a gas containing hydrogen and a gas containing fluorine (Refer to Patent Reference 2).

Patent Reference 1: Japanese Laid-open Patent Application 2002-261092

Patent Reference 2: Japanese Laid-open Patent Application 2001-110775

With the wafer ashing process when the aforementioned Low-K film is used as an interlayer insulation film, removing the resist by conventional ashing using oxygen ($O_2$) plasma is not suitable, so ashing gas conditions that are completely different from conventional are required, and plasma processing has been performed using hydrogen ($H_2$), nitrogen ($N_2$), or ammonia ($NH_3$) and the like. However, there are problems with the processing capability of the plasma processing equipment when these ashing gas conditions are used.

In other words, with a gas blend of nitrogen and hydrogen disclosed in Patent Reference 1, as shown in FIG. 4 for example, the ashing rate is high, but as shown in FIG. 3, there is a large increase in the dielectric constant. Furthermore, with a gas blend of gases containing hydrogen and gases containing fluorine according to Patent Reference 2, there is a dramatic increase in the dielectric constant and the film properties may be degraded.

DISCLOSURE OF THE INVENTION

The present invention was proposed in order to resolve the problems with the aforementioned conventional technology, and an object of the present invention is to provide an ashing device and ashing method which can positively remove resist from the wafer while preventing degradation of film properties for Low-K film (especially Low-K film that uses porous material) that is exposed on the wafer. Note, in the following description, weight ratios expressed as percentages are on a mass basis unless otherwise noted.

In order to accomplish the aforementioned object, the present invention is an ashing method of introducing a gas to a plasma generating chamber formed at least in part of a dielectric material, exciting the gas to generate a plasma, and performing plasma processing using the gas plasma on a processing subject in use of a Low-K film, the method comprising the steps of: introducing an inert gas to which $H_2$ has been added to the plasma generating chamber; generating plasma by exciting the inert gas; and removing resist that is on the processing subject by hydrogen radicals that are generated.

With this embodiment, if an inert gas to which $H_2$ has been added is used as the ashing gas, the change in the dielectric constant will be minimal, and the ashing rate will be high. Because the ashing rate can be increased while reducing the increase in the dielectric constant by using an inert gas to which $H_2$ has been added as the ashing gas, degradation of the film properties of a porous Low-K film can be prevented, and resist can positively be removed from the wafer.

In a preferred embodiment, $H_2$ is added to an inert gas at a ratio of between 1 and 20%. In the aforementioned embodiment, if the ratio of H2 added to the inert gas is in a range between 1 and 20%, the change in the ashing rate compared to the change in $H_2$ will be within the range permitted by the processing capability, and the ashing process will be stable.

In a preferred embodiment, $H_2O$ is added to the inert gas to which $H_2$ has been added, plasma is generated using the gas blend, and the resist on the processing subject is removed by the hydrogen radicals that are generated. Furthermore, the preferred embodiment is characterized by also adding $H_2O$ to the inert gas to which $H_2$ has been added.

In this embodiment, deactivation of the H radical is dramatically reduced by adding $H_2O$ to the inert gas, and as a result, the amount of H radical that reaches the wafer can be increased. Thereby, the peeling residual can be improved without extending the processing time. An additional effect is that a reducing effect on the dielectric material section as well as on other materials of the plasma generating chamber inner surface or the like can be minimized or prevented, thus contributing to increased life of the plasma generating chamber member.

In a preferred embodiment, $H_2O$ is added to the inert gas at a ratio of between 0.1 and 5%. In this embodiment, deactivation of the H radical is dramatically reduced by adding between 0.1 and 5% $H_2O$ to the inert gas, and as a result the amount of H radical that reaches the wafer can be increased. Thereby, the peeling residual can be improved without extending the processing time. An additional effect is that a reducing effect on the dielectric material section as well as on other materials of the plasma generating chamber inner surface or the like can be minimized or prevented, thus contributing to increased life of the plasma generating chamber member.

In a preferred embodiment, $O_2$ is added to the inert gas to which $H_2$ has been added, plasma is generated using this inert gas, and the resist on the processing subject is removed by hydrogen radicals that are generated. In this embodiment, deactivation of the H radical is dramatically reduced by adding $O_2$ to the inert gas, and as a result the amount of H radical that reaches the wafer can be increased. Thereby, the peeling residual can be improved without extending the processing time. An additional effect is that a reducing effect on the dielectric material section as well as on other materials of the plasma generating chamber inner surface or the like can be minimized or prevented, thus contributing to increased life of the plasma generating chamber member.

In a preferred embodiment, $O_2$ is added to the inert gas at a ratio of between 0.01 and 0.1%. In this embodiment, deactivation of the H radical is dramatically reduced by adding between 0.01 and 0.1% $O_2$ to the inert gas, and as a result the amount of H radical that reaches the wafer can be increased. Thereby, the peeling residual can be improved without extending the processing time. An additional effect is that a reducing effect on the dielectric material section as well as on other materials of the plasma generating chamber inner surface or the like can be minimized or prevented, thus contributing to increased life of the plasma generating chamber member.

In a preferred embodiment, the inert gas is consisting of He. In this embodiment, He causes the level of metastable state energy to be high, and for instance, even if trace amounts of $H_2$ are added, the startup of the in the ashing rate will be fast. Furthermore, He is an atom with a mass essentially equal to that of $H_2$, so the gas diffusion will be favorable, and the distribution of the ashing process on the wafer surface can be expected to be uniform. Furthermore, a stable processing operation can be performed.

In a preferred embodiment, the positional relationship between the processing subject and the plasma generating chamber is arranged to prevent linear irradiation so that ultraviolet rays included in the plasma do not directly radiate onto the processing subject from the plasma generating chamber. In this type of embodiment, the ultraviolet rays included in the plasma that is generated in the plasma generating chamber will be eliminated prior to reaching the processing subject, and only radicals will be supplied to the surface of the processing subject. Therefore, the increase in the dielectric constant of the processing subject caused by impingement of ultraviolet light on the processing subject can be reduced.

With the present invention as described above, the ashing rate can be increased while an increase in the dielectric constant can be minimized by using a gas blend of $H_2$ and inert gas as the ashing gas. Therefore, degradation of the film properties of Low-K film (especially Low-K film which uses porous materials) can be prevented, and resist can positively be removed from the wafer. Furthermore, if He is used as the inert gas, favorable results with no change in the dielectric constant can be achieved.

Furthermore, deactivation of H radical can be dramatically minimized by adding $H_2O$ or $O_2$ to the gas blend of $H_2$ and inert gas, and as a result, the peeling residue can be improved for the same processing time because the level of H radical that reaches the wafer is increased, and furthermore as an additional result, reducing of the material on the inner surface of the plasma generating chamber can be reduced, thus contributing to the extended life of the plasma generating chamber materials.

BEST MODE FOR CARRYING OUT THE INVENTION

Figure 1:
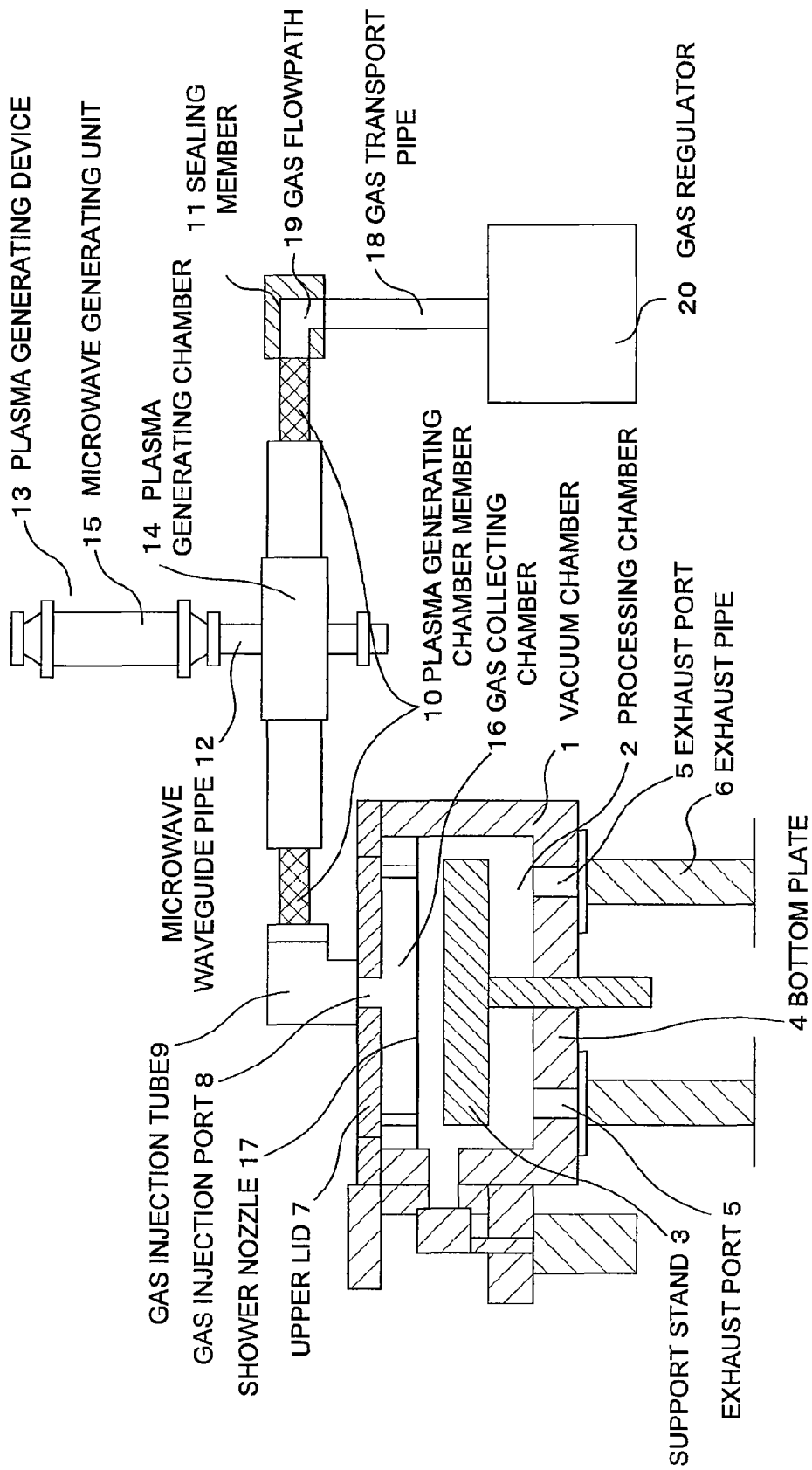
FIG. 1 is a block diagram showing the first embodiment of the present invention.

Next, the mode for carrying out the present invention (hereinafter referred to as embodiment) will be described in detail while referring to the drawings. Note, in the following description, weight ratios expressed as percentages are on a mass basis unless otherwise noted.

[First Embodiment]

The ashing device of the present embodiment provides a process chamber 2 which is a vacuum chamber 1 inside a vacuum chamber 1 as shown in FIG. 1. A support stand 3 is provided in the process chamber 2, and the processing subject S is placed on the support stand 3. Note, the support stand 3 has a temperature control mechanism not shown in the drawings, and the temperature of the processing subject S can be controlled by this temperature control mechanism. The processing subject includes silicon wafers for manufacturing semiconductor devices and glass substrates for liquid crystal display devices.

An exhaust port 5 is formed in the bottom plate 4 of the vacuum chamber 1, and an exhaust pipe 6 connected to a vacuum pump (not shown in the drawings) on one end is attached to the exhaust port 5. Furthermore, a gas injection port 8 is formed in the center of the upper lid 7 which forms the top plate of the vacuum chamber 1, and a gas injection pipe 9 made of a fluorine based resin is attached to the gas injection port 8.

A plasma generating chamber member 10 is connected to the gas injection pipe 9. Quartz ($SiO_2$), alumina ($Al_2O_3$), sapphire, or aluminum nitride or the like can be used as the dielectric material which forms the plasma generating chamber member 10.

Furthermore, a sealing member 11 is attached to the other end of the plasma generating chamber member 10, and the inside of the sealing member 11 forms a gas flow path 19. A gas transport pipe 18 is connected to the sealing member 11, and a gas regulator 20 that supplies ashing gas to the plasma generating chamber member 10 is provided on the other end of the gas transport pipe 18.

A radical generating means comprising a microwave waveguide pipe 12, or in other words a plasma generating unit 13, is provided along the plasma generating chamber member 10 so as to encompass the plasma generating chamber member 10, and a plasma generating chamber 14 is formed inside the plasma generating chamber member 10 which is encompassed by the plasma generating unit 13. Therefore, the plasma generating chamber 14 is provided on the outside of the vacuum chamber 1. The microwave generating unit 15 is connected to the microwave waveguide pipe 12.

Furthermore, a gas storage chamber 16 is formed on the top of the process chamber 2 and a shower nozzle 17 is provided in order to uniformly supply the radicals (etching seed) injected into the process chamber 2 through the gas injection port 8 formed in the upper lid 7 (top plate) of the vacuum chamber 1 across the whole surface of the processing subject S. Furthermore, a plurality of gas spray holes are formed in the shower nozzle 17.

This embodiment is characterized by the fact that the composition ratio of the ashing gas introduced to the plasma generating chamber member 10 is controlled by the gas regulator 20 when ashing is performed using the aforementioned ashing device. In other words, the ashing gas used in the present embodiment is an inert gas to which $H_2$ has been added. Plasma is generated using this gas blend, and the resist is removed by the hydrogen radicals that are generated. The inert gas used may be for instance helium (He) or argon (Ar).

Figure 2:
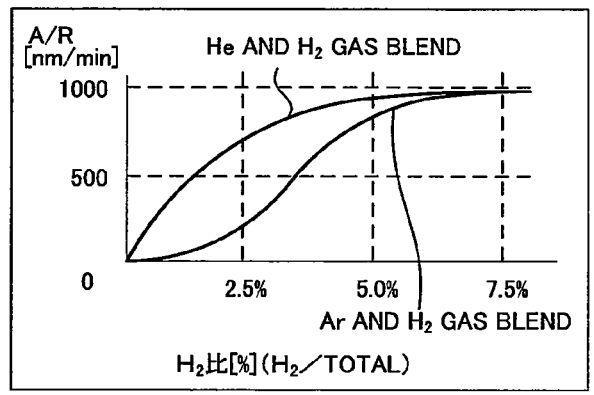
FIG. 2 is a diagram showing the change in the ashing rate when $H_2$ is added to the inert gas.

The ratio of $H_2$ gas in the ashing gas is within a range between 1 and 20% of the total mass flow, but, is preferably approximately 5% or higher which is essentially the saturation level for the ashing rate (A/R) as shown in FIG. 2.

Furthermore, the rise in the ashing rate will be fast even when trace amounts of $H_2$ are added because He has a higher metastable state energy than does Ar. Therefore, when the $H_2$ ratio is in a range around 5%, the rate saturated He will have less variation compared to the relative change of $H_2$, which is preferable. Furthermore, He is an atom with a mass essentially equal to that of $H_2$, so the gas diffusion will be favorable compared to when Ar is used, and the distribution of the ashing process on the wafer surface can be expected to be uniform. Therefore the use of He is preferable in order to achieve a stable process.

Therefore, as shown in FIG. 2, favorable results can be obtained for the damage (degradation) to the Low-K film without changing the dielectric constant when He or Ar with $H_2$ added is used as the ashing gas. In contrast, when 5% $O_2$ is added to He to make the ashing gas, the ashing rate will be high as shown in FIG. 4, but there will be problems with a significant increase in the dielectric constant as shown in FIG. 3.

Figure 3:
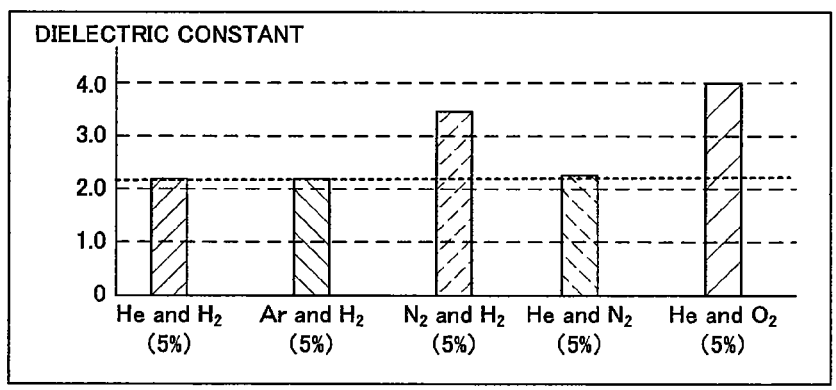
FIG. 3 is a diagram showing the change in the dielectric constant when $H_2$ is added to the inert gas.
Figure 4:
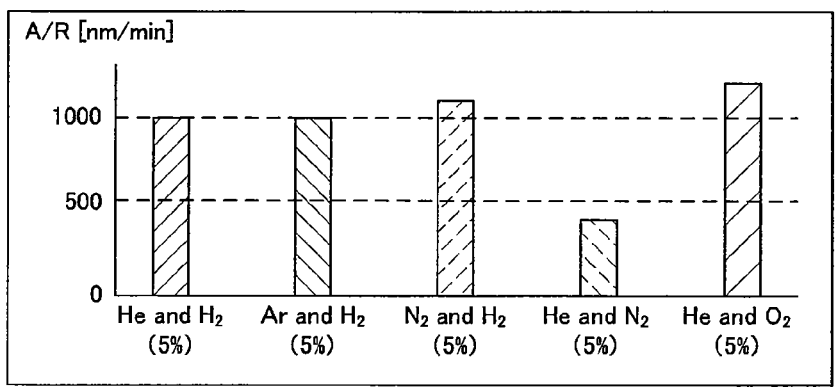
FIG. 4 is a diagram showing the changes to the ashing rate when $H_2$ is added to the inert gas.

Furthermore, as shown in FIG. 3, when 5% $N_2$ is added to He to make the ashing gas, the change in the dielectric constant was minimal, but as shown in FIG. 4, the ashing rate was less than half that when the ashing gas is He or Ar with 5% $H_2$ added. In other words, when $N_2$ is used, the Low-K film will be not be damaged, but there will be problems with processing capacity for the resist removing equipment. Furthermore, when $N_2$ with 5% $H_2$ is used as the ashing gas, the ashing rate will be similar to the case where 5% $H_2$ is added to He or Ar, but there will be a significant increase in the dielectric constant.

On the other hand, as shown in FIG. 3, if an inert gas such as He or Ar with 5% $H_2$ added is used as the ashing gas, the change in the dielectric constant will be minimal, and as shown in FIG. 4, the ashing rate will be high. Therefore, by using a gas blend of He or Ar with $H_2$ as the ashing gas, the ashing rate can be increased and the increase in the dielectric constant can be kept minimal, so degradation of the film properties for porous Low-K films can be prevented, and resist can positively be removed from wafers.

Note, the total flow of the ashing gas can be 1 slm (standard liter/minute) or higher, but as the flow rate increases, the ashing rate can be increased, so using a rate of approximately 7 slm is preferable. Furthermore, the processing pressure can be within a range between 50 Pa and 200 Pa.

Furthermore, when ultraviolet light contacts with a Low-K film, the dielectric constant will increase. The effect of the gas composition ratio is stronger than the effect of ultraviolet light described above, but with Low-K films which use a porous material with a low dielectric constant (K=2 or lower), the effect is remarkable. Therefore, with this embodiment, the ultraviolet light is shielded to prevent direct irradiation of ultraviolet light from the plasma generating unit on to the processing subject, so the positional relationship between the processing subject and the plasma generating unit is arranged so that there will not be linear irradiation.

Figure 5:
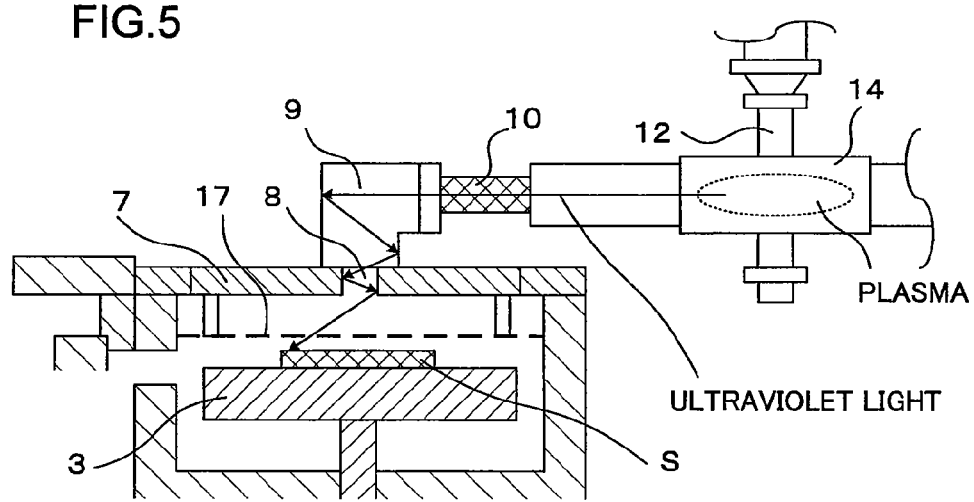
FIG. 5 is a partial expanded diagram showing the structure of the first embodiment of the present invention.

Specifically, as shown in FIG. 5, a bend is provided between the plasma generating chamber 14 and the gas injection tube 9 or the gas injection port 8, so ultraviolet light will not directly impinge on the processing subject S. Furthermore, a construction where the ultraviolet light is shielded such as by applying an ultraviolet light absorbing material to the shower nozzle 17 is also possible. Thereby the ultraviolet rays included in the plasma generated in the plasma generating chamber 10 will be eliminated prior to reaching the processing subject S, and only radicals will be supplied through the shower nozzle 17 to the surface of the processing subject S in the process chamber 2.

Figure 6:
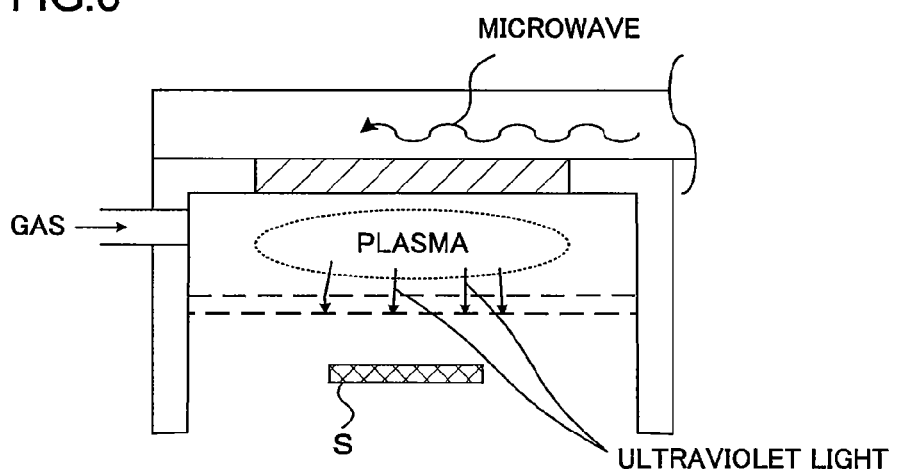
FIG. 6 is a partial expanded diagram showing an alternate example of the first embodiment of the present invention.

Note, the present embodiment described the case of a CDE (chemical dry etching) device, but the aforementioned shielding construction of the present invention is not restricted to this, and for instance, the down-flow type dry etching device shown in FIG. 6 has an overlapping construction where the position of the holes of the shower nozzle (punching plate) are staggered, and thereby, direct radiation by ultraviolet light onto the processing subject S can be prevented. Furthermore, similar to as shown above, an ultraviolet light can be absorbed by applying an ultraviolet light absorbing material to the shower nozzle.

Second Embodiment

The ashing device according to the second embodiment adds a change to the composition of ashing gas that is injected from the gas regulator 20 in the first embodiment. Specifically, a composition where between 0.01% and 0.1% $O_2$ or between 1% and 5% $H_2O$ is added to the $H_2$ and He gas blend. Note, other components are similar to the aforementioned first embodiment and have been omitted from the description.

With a resist ashing process where a Low-K film is exposed on the processing subject S (wafer), peeling residue occurs after ashing in a process where an $H_2$ and He gas blend is used as the ashing gas. If the plasma generating chamber member 10 is made from $SiO_2$ as described above, when a gas containing $H_2$ is supplied from the gas regulator 20 and the hydrogen plasma is excited in the plasma generating chamber 14 over a discharge time of several tens of hours, the $SiO_2$ that forms the plasma generating chamber member 10 will be reduced to Si. When the $SiO_2$ is converted to Si by reduction from the hydrogen plasma, the H radicals required for ashing will be dramatically deactivated. Therefore, the ashing rate will normally be reduced after several tens of hours, and therefore peeling residual will occur after ashing. This peeling residual can be eliminated by extending the processing time, but this will reduce the efficiency of the processing operation.

With this embodiment, between 1 and 5% $H_2O$ is added to the gas blend of $H_2$ and He in order to prevent this peeling residual. If $H_2O$ is added in this manner, oxygen plasma will be generated in the plasma generating chamber 14. Furthermore, reduction of the dielectric material (discharge tube and dielectric material window) of the plasma generating chamber member 10 will be prevented by the oxygen plasma, and the dielectric material will be reoxidized. Therefore, the deactivation of H radical will be dramatically reduced, and as a result, the amount of H radical that reaches the wafer will be increased so peeling residual can be resolved without increasing the processing time. An additional effect is that the reducing effect on the dielectric material section as well as on other materials of the plasma generating chamber member 10 inner surface or the like can be minimized or prevented, thus contributing to increased life of the plasma generating chamber member 10.

Figure 7:
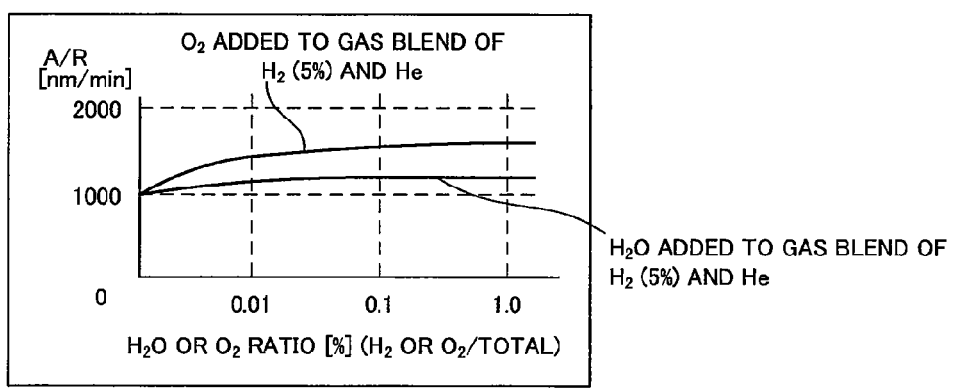
FIG. 7 shows the change in the ashing rate when $H_2O$ is added to a gas blend of $H_2$ and He.
Figure 8:
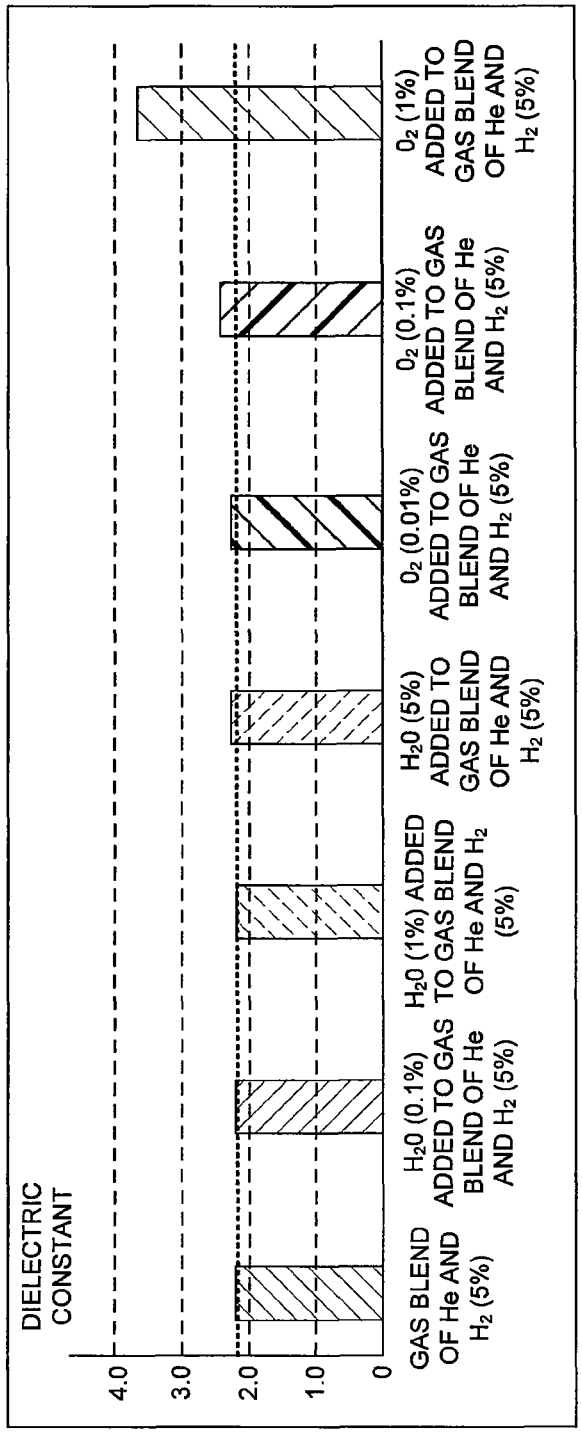
FIG. 8 is a diagram showing the change in the dielectric constant when $H_2O$ or $O_2$ is added to a gas blend of $H_2$ and He.

FIG. 8 shows the change in the dielectric constant of a Low-K film and FIG. 7 shows the change in the ashing rate of the case where $H_2O$ is added. Furthermore, FIG. 8 shows the change in the dielectric constant when $O_2$ is added as compared to $H_2O$.

As can be seen from FIG. 7, the ashing rate can be increased to 1000 nm/min or higher by adding $H_2O$ to the gas blend of $H_2$ and He. This is due to the aforementioned increase in the amount of H radical reaching the wafer in conjunction with the effect of the oxygen radical generated. Therefore, the peeling residual on the wafer can be eliminated without extending the processing time. Furthermore, as shown in FIG. 8, when 0.1 to 5% of $H_2O$ is added, there is almost no change in the dielectric constant of the Low-K film, and favorable film properties are obtained.

Similarly, when $O_2$ is added in order to eliminate the peeling residual without extending the processing time, there will be a change to the material properties of the Low-K film when a small amount of approximately 1% of $O_2$ is added, but as can be seen in FIG. 8, use of $O_2$ is possible if the amount added is approximately 0.1%.

The reason that the permissible range for the amount of $O_2$ added is narrower than that of $H_2O$ is not definitely understood, but is thought to be affected by the difference in the life of the $O_2$ radical generated when $O_2$ is added and when $H_2O$ is added, and to the difference that the activity level (reactivity) towards Low-K film has on the change in the dielectric constant. With Low-K films with lower dielectric constants which use porous materials, a change in the dielectric constant can easily occur, so the amount of $O_2$ added is preferably 0.01% or less.

In this manner, when $H_2O$ is added, or when $O_2$ is added, the change in the dielectric constant will be similar, but the ashing rate will be superior if $O_2$ is added. On the other hand, the amount of $O_2$ added must be held to very small quantities, and the range across which the dielectric constant will not rise is narrow, between 0.01 and 0.1%. Therefore, minute changes in the flow rate during the actual processing operation can have a major impact on the increase in the dielectric constant. In contrast, when $H_2O$ is added, the range that can be permitted is broad, between 0.1 and 5%, so even if the flow rate or the like varies somewhat during the actual processing operation, the effect on increasing the dielectric constant will be minimal, and the processing operation can be stable.

As described above, deactivation of H radical can be dramatically reduced by adding either between 0.01% and 0.1% of $O_2$ or between 0.1 and 5% of $H_2O$ to the gas blend of $H_2$ and He that is injected from the gas regulator 20, and as a result, the amount of H radical that reaches the wafer can be increased. Thereby, the peeling residual can be improved without extending the processing time. An additional effect is that the reducing effect on the dielectric material section as well as on other materials of the plasma generating chamber inner surface or the like can be minimized or prevented, thus contributing to increased life of the plasma generating chamber materials.

Other Embodiments

Note, the ashing device and ashing method of the aforementioned embodiments can not only be used for resist ashing on a wafer, but for instance can also be used as an etching device and etching method for removing spontaneously generated oxides or for directly etching Low-K films.

Furthermore, in the aforementioned embodiments, an example where Ar or He is used as the inert gas was presented, and He was described as being particularly preferable, but Ne may also be used in place of the Ar, and although processing uniformity will be lost by using heavy gases such as Kr (krypton), Xe (xenon), and Rn (radon), a similar effect can be anticipated.

With the aforementioned embodiments, the use of a chemical dry etching device or a down-flow type dry etching device was described, but the present invention can be achieved not only by these devices, but by any device that can perform ashing primarily using radicals, and is preferably a device that can shield ultraviolet light.

Text in Figures

FIG. 1
9 Gas injection tube
8 Gas injection port
17 Shower nozzle
7 Upper lid
3 Support stand
5 Exhaust port
12 Microwave waveguide pipe
4 Bottom plate
13 Plasma generating device
15 Microwave generating unit
14 Plasma generating chamber
10 Plasma generating chamber member
16 Gas collecting chamber
1 Vacuum chamber
2 Processing chamber
5 Exhaust port
6 Exhaust pipe
11 Sealing member
19 Gas flowpath
18 Gas transport pipe
20 Gas regulator
FIG. 2
He and $H_2$ Gas blend
Ar and $H_2$ Gas blend
FIG. 3
Dielectric constant
He and $H_2$ (5%)
Ar and $H_2$ (5%)
$N_2$ and $H_2$ (5%)
He and $N_2$ (5%)
He and $O_2$ (5%)
FIG. 4
He and $H_2$ (5%)
Ar and $H_2$ (5%)
$N_2$ and $H_2$ (5%)
He and $N_2$ (5%)
He and $O_2$ (5%)
FIG. 5
Ultraviolet light
Plasma
FIG. 6
Gas
Microwave
Plasma ultraviolet light
FIG. 7
$O_2$ Added to gas blend of $H_2$ (5%) and He
$H_2O$ Added to gas blend of $H_2$ (5%) and He
$H_2O$ or $O_2$ Ratio [%] ($H_2$ or $O_2$/total)
FIG. 8
Dielectric constant
Gas blend of He and $H_2$ (5%)
$H_2O$ (0.1%) Added to gas blend of He and $H_2$ (5%)
$H_2O$ (1%) Added to gas blend of He and $H_2$ (5%)
$H_2O$ (5%) Added to gas blend of He and $H_2$ (5%)
$O_2$ (0.01%) Added to gas blend of He and $H_2$ (5%)
$O_2$ (0.1%) Added to gas blend of He and $H_2$ (5%)
$O_2$ (1%) Added to gas blend of He and $H_2$ (5%)

The invention claimed is:

1. An ashing method of introducing a gas to a plasma generating chamber formed, at least in part of dielectric material, exciting said gas to generate a plasma, and performing plasma processing using said gas plasma on a processing subject in use of Low-K film, said method comprising the steps of:
introducing a gas blend to said plasma generating chamber, wherein the gas blend is prepared as a result of preparing an inert gas to which $H_2$ has been added at a weight ratio between 1% and 20% on a mass basis, wherein $H_2O$ is also added at a weight ratio between 0.1% and 5% on a mass basis to said inert gas to which $H_2$ has been added; and
generating plasma by exciting said gas blend and removing resist on said processing subject by hydrogen radicals that are generated.

2. The ashing method according to claim 1, wherein said inert gas comprises He.

3. The ashing method according to claim 1, wherein:
said Low-K film is positioned as an insulating layer between at least two integrated circuit layers of a chip, and
the steps of generating said plasma by exciting said gas blend and removing said resist on said processing subject are performed after forming said Low-K film on a substrate and after etching said Low-K film using said resist as a mask.

4. The ashing method according to claim 3, wherein the steps of generating plasma by exciting said gas blend and removing said resist on said processing subject further generate oxygen radicals, increase an ashing rate of said resist and suppress change in a dielectric constant of the Low-K film.

5. An ashing method of introducing a gas to a plasma generating chamber formed, at least in part of dielectric material, exciting said gas to generate a plasma, and performing plasma processing using said gas plasma on a processing subject in use of Low-K film, said method comprising the steps of:
introducing a gas blend to said plasma generating chamber, wherein the gas blend is prepared as a result of preparing an inert gas to which $H_2$ has been added at a weight ratio between 1% and 20% on a mass basis, wherein $O_2$ is also added at a weight ratio between 0.01% and 0.1% on a mass basis to said inert gas to which $H_2$ has been added; and
generating plasma by exciting said gas blend and removing resist on said processing subject by hydrogen radicals that are generated.

6. The ashing method according to claim 5, wherein said inert gas comprises He.

7. The ashing method according to claim 5, wherein:
said Low-K film is positioned as an insulating layer between at least two integrated circuit layers of a chip, and
the steps of generating said plasma by exciting said gas blend and removing said resist on said processing subject are performed after forming said Low-K film on a substrate and after etching said Low-K film using said resist as a mask.

8. The ashing method according to claim 7, wherein the steps of generating plasma by exciting said gas blend and removing said resist on said processing subject further generate oxygen radicals, increase an aching rate of said resist and suppress change in a dielectric constant of the Low-K film.

* * * * *